United States Patent
Mitsuoka et al.

(10) Patent No.: US 7,521,098 B2
(45) Date of Patent: Apr. 21, 2009

(54) METHOD OF PROCESSING AN ORGANIC-FILM

(75) Inventors: Kazuyuki Mitsuoka, Nirasaki (JP); Tadashi Onishi, Nirasaki (JP); Minoru Honda, Nirasaki (JP); Ryuichi Asako, Nirasaki (JP); Mitsuaki Iwashita, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 407 days.

(21) Appl. No.: 10/727,038

(22) Filed: Dec. 4, 2003

(65) Prior Publication Data

US 2005/0042388 A1  Feb. 24, 2005

(30) Foreign Application Priority Data

Dec. 4, 2002  (JP)  ............... 2002-353140

(51) Int. Cl.
H05B 7/00 (2006.01)
B05D 3/06 (2006.01)
C23C 14/30 (2006.01)

(52) U.S. Cl. .............. 427/596; 427/551; 427/331; 427/372.2; 427/384; 427/387; 427/496; 427/503

(58) Field of Classification Search ......... 427/496–507, 427/493, 384, 372.2, 596, 532, 551, 595, 427/331, 387

See application file for complete search history.

(56) References Cited

U.S. PATENT DOCUMENTS

| 6,420,088 | B1 * | 7/2002 | Angelopoulos et al. .. 430/272.1 |
| 2001/0000415 | A1 * | 4/2001 | Ross ......................... 257/734 |
| 2002/0123240 | A1 * | 9/2002 | Gallagher et al. .......... 438/781 |

FOREIGN PATENT DOCUMENTS

| JP | 2000-53868 | 2/2000 |
| JP | 2000-221699 | 8/2000 |

* cited by examiner

*Primary Examiner*—William Phillip Fletcher, III
*Assistant Examiner*—Cachet I Sellman
(74) *Attorney, Agent, or Firm*—Smith, Gambrell & Russell, LLP

(57) ABSTRACT

A processing method according to the present invention coats a polar liquid film or forms an inorganic film on a surface of an organic film formed on a substrate as a protective film. The processing method comprises a modifying step of curing an organic film by irradiating the organic film with electron beams by means of an electron-beam irradiation device in a rare gas atmosphere, and an applying step of applying a polar liquid to the modified surface of the organic film or a film forming step of forming an inorganic film on the organic film. The organic film is cured and affinity for the polar liquid or the inorganic film is imparted to the organic film.

12 Claims, 8 Drawing Sheets

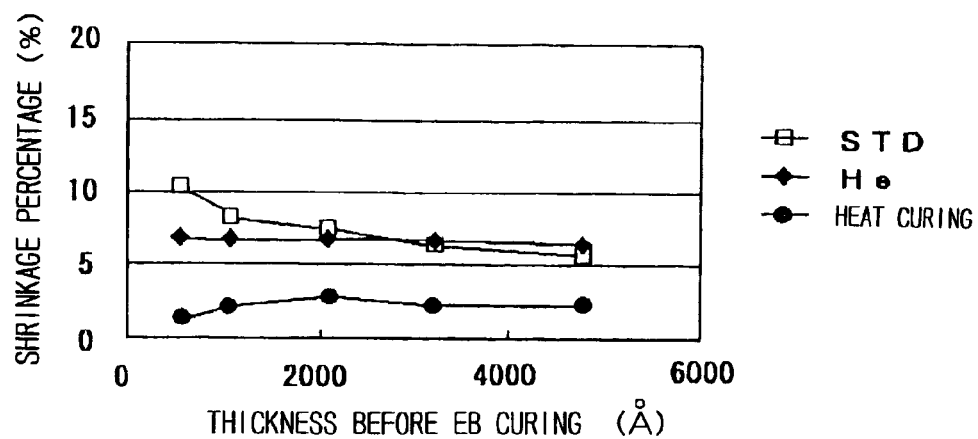
F I G. 5a
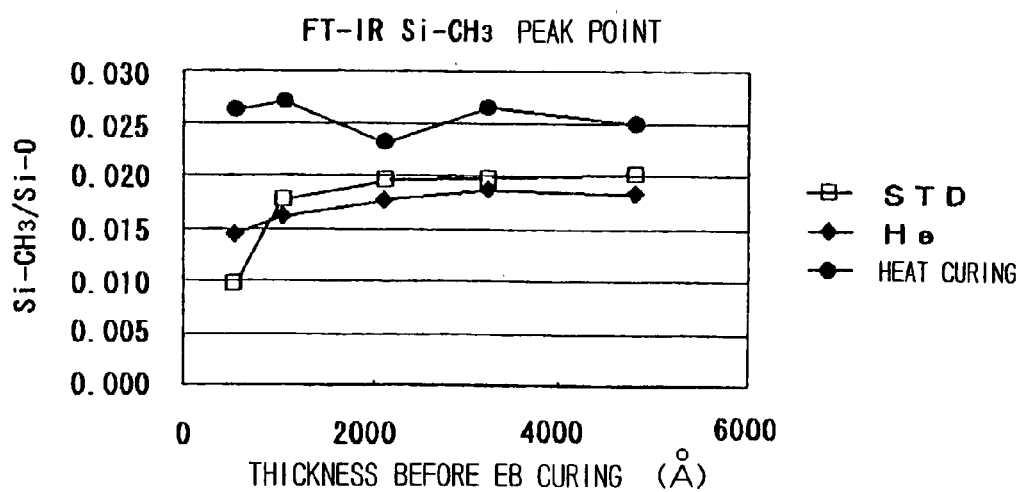
F I G. 5b

METHOD OF PROCESSING AN ORGANIC-FILM

BACKGROUND OF THE INVENTION

1. Field of the Invention

The present invention relates to a method of processing an organic film as an interlayer dielectric film formed on a substrate, such as a semiconductor wafer. More specifically, the present invention relates to a method of modifying an organic film formed on a substrate, and coating the modified organic film with a polar liquid or forming an inorganic film on the modified organic film.

2. Description of the Related Art

Reduction of capacitance between wiring lines has progressively become important with the miniaturization of wiring structures to deal with increase in the degree of integration and operation speed of semiconductor devices. Conventional interlayer dielectric films are $SiO_2$ films and SiOF films formed by a CVD process. The $SiO_2$ film has a dielectric constant k in the range of 4.0 to 4.2. Although the dielectric constant k of the SiOF film is smaller than that of the $SiO_2$ film, the dielectric constant k is still in the range of 3.5 to 3.8. A dielectric constant k at such a level is not small enough for a design rule specifying dimensions of 0.18 μm or below, and an interlayer dielectric film having a smaller dielectric constant is needed.

Various low-k materials, i.e., organic film-forming materials having a small dielectric constant, have been developed in recent years. The low-k material is spread over the surface of a substrate in a film by a spin coater, and the film is baked in a baking furnace to form a SOD film having a small dielectric constant as an interlayer dielectric film on the substrate. Since SOD films are organic films and some SOD film is formed in a high porosity to reduce dielectric constant, SOD films have low mechanical strength. Therefore, the SOD film is damaged in some cases when stressed in processing the same by a CMP process or the like. A protective film (hard mask), such as an organic or inorganic film having a necessary mechanical strength, is formed on the low-k film to form a composite film having a small dielectric constant and a necessary mechanical strength.

Thus, the protective film is formed on the low-k film to construct an interlayer dielectric film or the like on a substrate. The low-k film is formed of a hydrophobic material so that the low-k film may not absorb moisture contained in the atmosphere. Therefore, the low-k film repels a hydrophilic chemical liquid applied thereto to form the protective film and, consequently, an irregular film of the hydrophilic chemical liquid is formed. A conventional method of preventing repelling the hydrophilic chemical liquid changes the hydrophobic surface of the low-k film into a hydrophilic surface by oxidization using ultraviolet irradiation or ozonation in order that a film of the chemical liquid having improved uniformity can be formed. A method of improving the adhesion of the protective film to the low-k film forms an intermediate layer on the low-k film.

The conventional method, however, needs an ultraviolet irradiation device or an ozonation device exclusive for changing the hydrophobic surface of the low-k film into a hydrophilic surface. The method using the intermediate layer suffers from the large dielectric constant of the intermediate layer, and needs work for applying a material to the low-k film to form the intermediate layer.

When the low-k film is used instead of the $SiO_2$-series dielectric film, and an inorganic protective film of $SiO_2$, SiN or SiC is deposited on the low-k film by a CVD process or the like, the protective film comes off the low-k film due to difference in molecular structure between the low-k film and the $SiO_2$, SiN or SiC protective film. The surface of the low-k film can be modified by oxidizing the surface by ultraviolet irradiation or ozonation; alkyl groups, such as methyl groups, are removed from the low-k film to make the molecular structure of the low-k film become similar to that of the inorganic protective film. This method, however, needs an ultraviolet irradiation device or an ozonation device exclusive for forming the inorganic protective film.

Various organic film modifying methods using electron beams have been proposed in recent years. For example, a film processing method disclosed in JP2000-221699A improves the quality of an organic film, such as a resist film or an antireflection film, by irradiating the organic film with electron beams in an atmosphere of an oxidizing gas or a reducing gas to promote the carbonization of the organic film. A film quality improving method disclosed in JP11-506872T improves the heat resistance and plasma resistance of an organic film having a small dielectric constant by irradiating the organic film with electron beams in an atmosphere of Oxygen, argon (Ar), nitrogen ($N_2$), helium (He) or a mixture of some of those to cure a dielectric substance. A surface roughening method disclosed in JP2000-053868A cures a resin composition by heating or by irradiation with ultraviolet rays or electron beams.

Those prior art methods disclosed in those references cures the surface of an organic film by promoting the carbonation, oxidation or reduction of the organic film through the irradiation of the organic film with electron beams. Although those prior art methods are able to cure the surface of the organic film by using electron beams, it is difficult to impart wettability to the organic film and to improve the adhesion of the dielectric film to the organic film by those prior art methods. Consequently, it is difficult to form an organic dielectric film having a small dielectric constant and high mechanical strength.

A technique disclosed in JP11-50687T imparts a hydrophilic property to the surface of an organic film by roughening the surface of the organic film after the organic film has been cured. This prior art technique uses a plasma device and does not use electron-beam irradiation devices.

SUMMARY OF THE INVENTION

The present invention has been made to solve those problems and it is therefore an object of the present invention to provide a method of processing an organic-film using an electron-beam irradiation device, capable of enhancing adhesion between an organic film formed on a substrate, and a protective film or the like formed on the organic film, and increasing the mechanical strength of the organic film without increasing the dielectric constant of the organic film.

According to one aspect of the present invention, a method of forming a polar liquid film on a surface of an organic film formed on a substrate comprises: a modifying step of curing the organic film and imparting an affinity for the polar liquid to the organic film by irradiating the organic film with electron beams by means of an electron-beam irradiation device in a rare gas atmosphere; and an applying step of applying the polar liquid to the surface of the organic film processed by the modifying step.

This method can enhance the adhesion between the organic film formed on the substrate, and the polar liquid film formed on the organic film, and thereby the mechanical strength of the organic film can be improved without increasing the dielectric constant of the organic film.

According to another aspect of the present invention, a method of forming an inorganic film on a surface of an organic film formed on a substrate comprises: a modifying step of curing the organic film and imparting an affinity for the inorganic film to the organic film by irradiating the organic film with electron beams by means of an electron-beam irradiation device in a rare gas atmosphere; and an film forming step of forming the inorganic film on the surface of the organic film processed by the modifying step.

This method can enhance the adhesion between the organic film formed on the substrate, and the inorganic film formed on the organic film, and thereby the mechanical strength of the organic film can be improved without increasing the dielectric constant of the organic film.

Preferably, the modifying step of each method changes the pressure of a rare gas atmosphere and/or a voltage applied to the electron-beam irradiation device during irradiation with the electron beams.

Preferably, the modifying step of each method changes the pressure of the rare gas atmosphere from a first pressure to a second pressure higher than the first pressure. Preferably, the modifying step changes the voltage applied to the electron-beam irradiation device from a first voltage to a second voltage lower than the first voltage.

In each method according to the present invention, it is preferable that the pressure of the rare gas atmosphere in the modifying step is 1 torr or above and the voltage applied to the electron-beam irradiation device in the modifying step is 20 kV or below. It is preferable that the second pressure is 1 torr or above in changing the pressure of the rare gas atmosphere, and the second voltage is 20 kV or below in changing the voltage applied to the electron-beam irradiation device.

In each method, the organic film may be a film of a compound containing silicon, carbon, hydrogen and oxygen, particularly, a methylsilsesquioxane film.

BRIEF DESCRIPTION OF THE DRAWINGS

FIG. 5a is a graph showing the relation between the thickness of SOD film before processing, and the shrinkage percentages of SOD films caused by EB curing processes included in Example 1 of the present invention and Comparative example 1;

FIG. 5b is a graph showing the relation between the thickness of SOD films before processing, and methyl group content of the SOD film after being processed by Example 1 and Comparative example 1;

DESCRIPTION OF THE PREFERRED EMBODIMENTS

Preferred embodiments of the present invention will be described with reference the accompanying drawings.

An electron-beam irradiation device employed in carrying out a method in a first embodiment according to the present invention will be described with reference to FIG. 1.

Figure 1:
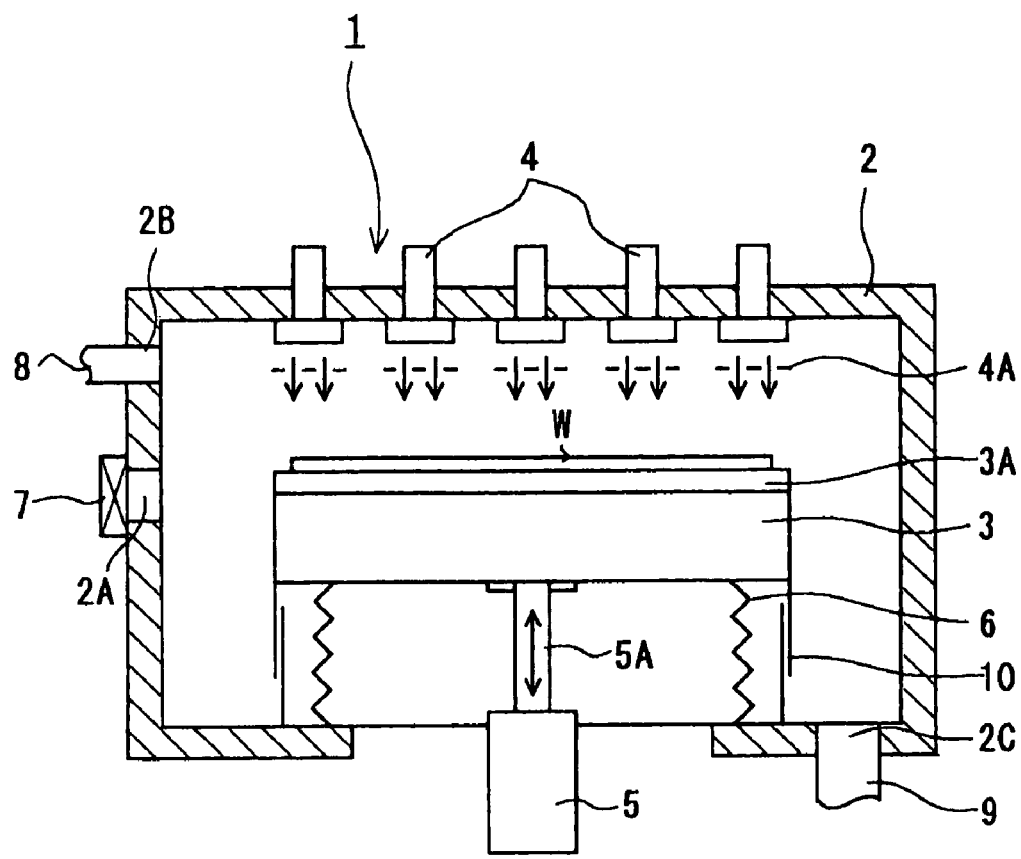
FIG. 1 is a schematic sectional view of an electron-beam processing device used for carrying out a method in a first embodiment according to the present invention.
Figure 2:
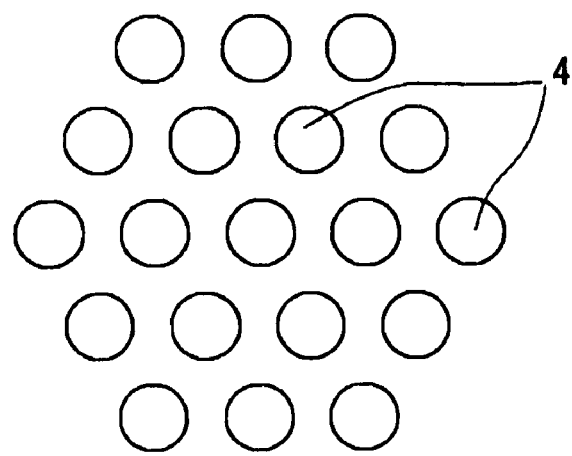
FIG. 2 is a plan view showing the arrangement of electron-beam tubes included in the electron-beam processing device shown in FIG. 1 in a horizontal plane.

Referring to FIG. 1, an electron-beam processing device 1 includes a processing vessel 2 of a metal, such as aluminum, capable of being evacuated, and a support table 3 disposed at the center of the bottom wall of the processing vessel 2 to support a substrate (wafer) W thereon. A plurality of electron-beam tubes (electron-beam irradiation devices) 4, for example, nineteen electron-beam tubes 4, are attached to the top wall of the processing vessel 2 opposite to the support table 3 in a concentric arrangement as shown in FIG. 2. A controller, not shown, to irradiate entirely a surface of the wafer W mounted on the support table 3 with electron beams emitted by the electron-beam tubes 4, controls the electron-beam processing device 1. A dielectric film (hereinafter, referred to as "SOD film") formed by coating on the wafer W is irradiated with electron beams emitted by the electron-beam irradiation device 4 for a modification process. When necessary, the modification process using electron beams will be referred to as "EB curing process".

The electron-beam processing device 1 is provided with a lifting mechanism 5 including a ball screw 5A having a threaded rod having an upper end connected to the lower surface of the support table 3. The lifting mechanism moves the support table vertically. A stainless steel bellows 6 has an upper end joined to the lower surface of the support table 3, and a lower end joined to the bottom wall of the processing vessel 2. The bellows 6 seals the processing vessel 2 hermetically. An opening 2A is formed in the side wall of the processing vessel 2, and a gate valve 7 is attached to the side wall so as to close the opening 2A. The gate valve 7 is opened when a wafer W is carried into or out of the processing vessel 2. A gas supply port 2B is formed in a part of the side wall above the opening 2A, and an exhaust port 2C is formed in the bottom wall of the processing vessel 2. A gas supply pipe 8 connected to a gas source, not shown, is connected to the gas supply port 2B. An exhaust pipe 9 connected to a vacuum system, not shown, is connected to the exhaust port 2C. A bellows cover 10 surrounds the bellows 6.

A heater 3A is placed on the support table 3 to heat the wafer W at a desired temperature. The nineteen electron-beam tubes 4 are arranged such that the one electron-beam tube 4 is disposed at the center of the top wall of the processing vessel 2, the six electron-beam tubes 4 are arranged around the electron-beam tube 4 at the center of the top wall of the processing vessel 2, and the twelve electron-beam tubes 4 are arranged around the six electron-beam tubes 4 as shown in FIG. 2. Each of the electron-beam tubes 4 is provided with electron-beam transmitting window disposed inside the processing vessel 2. The electron-beam transmitting windows are sealed with, for example, transparent quartz glass. As shown in FIG. 1, electron-beam detection grids 4A are disposed below the electron-beam transmitting windows, respectively. The electron-beam detection grids 4A measure dose on the basis of currents that flow when electrons collide against the electron-beam detection grids 4A, and send dose signal representing the dose to the controller. Then, the controller controls levels of power supplied to the electron-beam tubes 4.

The method using the electron-beam processing device 1 will be described.

The method irradiates an organic film, i.e., a SOD film, covering a wiring layer formed on a surface of a wafer W with electron beams for a modification process to modify the SOD film. Subsequently, the method applies a polar liquid to the modified SOD film to form an interlayer dielectric film.

The SOD film is formed of an organic material having a small dielectric constant, i.e., a low-k material. Preferably, the low-k material contains silicon (Si), carbon (C), hydrogen (H) and oxygen (O). Organic materials suitable for forming the SOD film include, for example, a polyorganosiloxane-crosslinked benzocyclobutene resin (BCB), polyarylene ether resins (PAEs), such as SiLK™ and FLARE™ commercially available from Dow Chemicals, and organic polysiloxane resins, such as methylsilsesquioxane (MSQ). The LKD commercially available from JSR Inc. is one of MSQ organic materials.

The polar liquid comprises a solvent and a resin dissolved or dispersed in the solvent, wherein the solvent is a polar solvent and/or molecules of the resin are polar molecules. The polar liquid used in the method includes, for example, a polyorganosiloxane-crosslinked benzocyclobutene resin (BCB), polyarylene ether resins (PAEs), such as SiLK™ and FLARE™ commercially available from Dow Chemicals, organic polysiloxane resins, such as methylsilsesquioxane (MSQ), and SOGs containing $SiO_2$ as a principal component. The LKD commercially available from JSR Inc. is one of MSQ organic materials.

Figure 3:
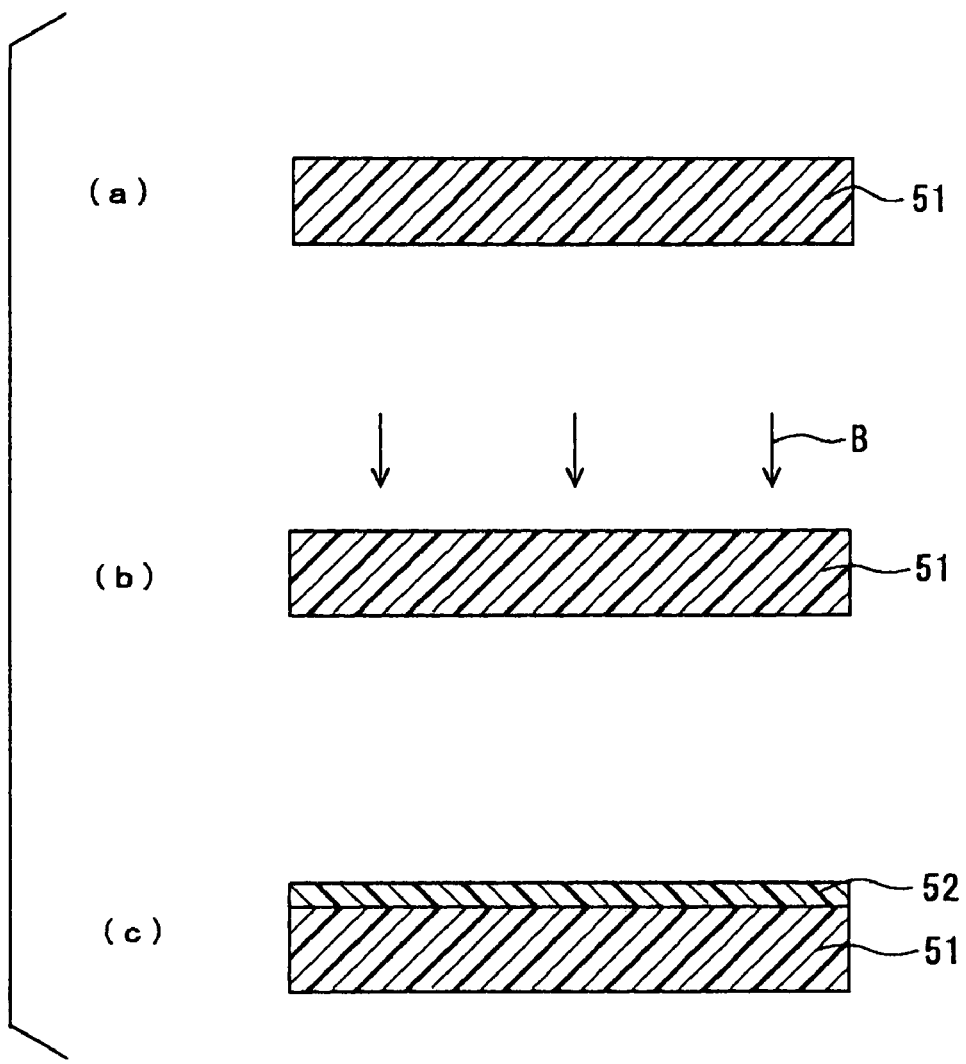
FIG. 3 is a typical sectional view of a workpiece in the sequential steps (a)-(c) of the method in the first embodiment using the electron-beam processing device shown in FIG. 1.

In the EB curing process for modifying the SOD film by electron-beam irradiation carries a wafer W having a surface coated with a SOD film 51 as shown in FIG. 3(a) to the electron-beam processing device 1. Then, the gate valve 7 is opened, the wafer W is carried through the opening 2A into the processing vessel 2, and the wafer W is placed on the support table 3. Then, the gate valve 7 is closed to seal the processing vessel 2 hermetically. the lifting mechanism 5 raises the support table 3 to locate the wafer W such that the surface of the wafer W is at a predetermined distance from the electron-beam tubes 4.

Subsequently, the processing vessel 2 is evacuated by exhausting air through the exhaust port 2C, and a rare gas is supplied to through the gas supply port 2B into the processing vessel 2. Thus, air contained in the processing vessel is purged and replaced with the rare gas to create a rare gas atmosphere in the processing vessel 2. The rare gas atmosphere is held at a predetermined pressure. The wafer W is heated by the heater 3A combined with the support table 3 and is kept at a predetermined temperature. Then, a predetermined voltage is applied to all the electron-beam tubes 4 to irradiate the SOD film 51 formed on the wafer W with electron beams B emitted by the electron-beam tubes 4 as shown in FIG. 3(b) to modify the SOD film 51.

Electrons of part of the electron beams B emitted by the electron-beam tubes 4 fall directly on the SOD film 51 and activates an organic compound in a surface layer of the SOD film 51 by their energy. Consequently, a crosslinking reaction occurs in the surface layer and thereby the SOD film 51 is caused to shrink and cured. Electrons of the rest of the electron beams B collide against and ionize the rare gas to produce a plasma. Consequently, radicals, ions and secondary electrons are generated. The ions and the secondary electrons react with the organic material in the vicinity of the surface of the SOD film 51 to reduce alkyl groups, such as methyl groups, and create an oxygen-rich atmosphere around the surface of the SOD film 51. This oxygen-rich atmosphere makes the surface of the SOD film 51 hydrophilic.

Then, a hydrophilic liquid film 52 of a polar liquid material is formed as a protective film over the surface of the cured SOD film 51 as shown in FIG. 3(c). The surface of the SOD film 51 does not repel the hydrophilic liquid film 52 and hence the hydrophilic liquid film 52 is able to coat the entire surface of the SOD film 51 uniformly.

A rare gas having an atomic number greater than that of Ar, such as krypton (Kr) or xenon (Xe), may be used instead of Ar. Atoms of a rare gas having an atomic number smaller than that of Ar, such as helium (He) or neon (Ne), are small and hence have a low probability of collision with electrons. Thus, such a rare gas having a small atomic number are difficult to ionize and not preferable. Preferably, the pressure of the rare gas atmosphere created in the processing vessel 2 is 1 torr or above, more preferably, in the range of 2 to 10 torr. A preferable temperature of the wafer W is, for example, between 200° C. and 400° C.

If the pressure of the rare gas atmosphere is below 1 torr, the electron beans tend to pass through the rare gas atmosphere without exerting significant effect on the rare gas atmosphere, i.e., without ionizing the rare gas. Consequently, the rare gas is not ionized properly and only the curing of the SOD film is advanced. If the pressure of the rare gas atmosphere is excessively high, the frequency of collision between the electrons of the electron beams and the atoms of the rare gas increases. The collision between the electrons of the electron beams and the atoms of the rare gas attenuates the energy of the electron beams and thereby the intensity of the electron beams falling on the wafer W is decreased sharply. Consequently, the curing of the SOD film cannot be properly achieved.

In the foregoing description, it is supposed that the pressure of the rare gas atmosphere and the voltage applied to the electron-beam tubes 4 are fixed during the EB curing process for irradiating the SOD film 51 with the electron beams B. The pressure of the rare gas atmosphere and/or the voltage applied to the electron-beam tubes 4 may be changed during the EB curing process.

The EB curing process can be divided into a first stage for curing the SOD film and a second stage of making the SOD film hydrophilic by changing the pressure of the rare gas atmosphere during the EB curing process to ensure that the SOD film is cured and made hydrophilic satisfactorily. For example, the rare gas atmosphere is kept at a pressure not higher than 1 torr and the SOD film is irradiated with electron beams to cure the SOD film in an initial stage of the EB curing process, and then the rare gas atmosphere is increased to a pressure higher than 1 torr to promote the generation of radicals by ionizing the rare gas. Consequently, the radicals act on the surface of the SOD film to make the surface of the SOD film hydrophilic by cutting chemical bonds of hydrophobic groups, such as alkyl groups.

The electron beams are able to penetrate deep into the SOD film to cure the SOD film by changing the voltage applied to the electron-beam tubes 4 to adjust the dose during the EB curing process. For example, a voltage higher than 20 kV is applied to the electron-beam tubes 4 to irradiate the SOD film with electron beams at a high dose in an initial stage of the EB curing process, so that the electron beams are able to penetrate deep into the SOD film for curing. Subsequently, a voltage lower than 20 kV is applied to the electron-beam tubes 4 to reduce the dose on the SOD film. Consequently, the direct incidence of electron beams on the surface of the SOD film is decreased relative to the reaction of radicals or the like with the plasma of the rare gas in the surface of the SOD film. Thus, the reaction in the surface of the SOD film is promoted to further enhance the mechanical strength of the surface.

Figure 4:
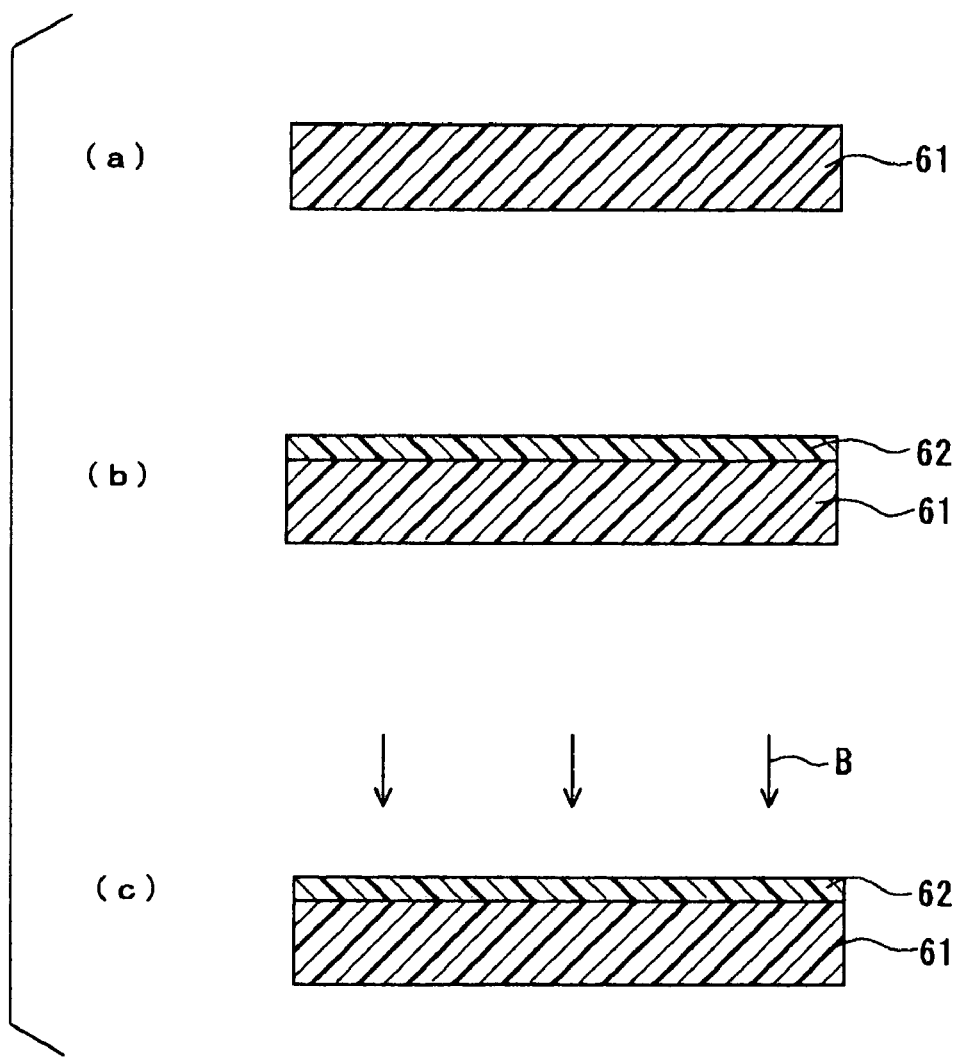
FIG. 4 is a typical sectional view, similar to FIG. 3, of a workpiece in the sequential steps (a)-(c) of a method in a second embodiment according to the present invention.

For example, a second SOD film 62 as a protective film is formed as shown in FIG. 4(b) by applying an organic material to a surface of a first SOD film 61 shown in FIG. 4(a). Then, an EB curing process is performed to irradiate the SOD films 61 and 62 with electron beams B as shown in FIG. 4(c). In a first half stage of the EB curing process, a high voltage is applied to the electron-beam tubes 4 to make electron beam penetrate deep into the first SOD film 61. Consequently, the second SOD film 62 is cured entirely to form a protective film having a high mechanical strength. In a second half stage of the EB curing process, a low voltage is applied to the electron-beam tubes 4 to promote reaction in the surface of the second SOD film 62. Consequently, hydrophobic groups, such as methyl groups, in the surface of the second SOD film 62 are decomposed. Consequently, the surface of the second SOD film 62 shrinks and the mechanical strength of the surface of the second SOD film 62 is further enhanced and the surface of the second SOD film 62 becomes hydrophilic. When the hydrophobic groups in the surface of the second SOD film 62 are thus decomposed, the molecular structure of the surface of the second SOD film 62 is modified and bears a closer resemblance to that of an inorganic film, and the affinity of the second SOD film 62 for an inorganic film can be enhanced.

The pressure of the rare gas atmosphere and the voltage applied to the electron-beam tubes 4 may be simultaneously changed or may be changed at different times, respectively. It is preferable to change the pressure of the rare gas atmosphere and the voltage applied to the electron-beam tubes 4 at different times, respectively, to distinguish the process for curing the film and the process for making the film hydrophilic from each other. It is preferable for high throughput to change the pressure of the rare gas atmosphere and the voltage applied to the electron-beam tubes 4 simultaneously.

An EB curing process similar to the foregoing EB curing process can be performed by using the electron-beam processing device 1 in forming a protective film of an inorganic material, such as $SiO_2$, SiN, SiC or the like on the SOD film (low-k film). First a high-density surface layer having a high mechanical strength can be formed by curing the surface of the SOD film by irradiating the surface of the SOD film with electron beams in a rare gas atmosphere. The surface of the SOD film can be modified into a surface having a SiO-rich molecular structure by decomposing hydrophobic groups, such as methyl groups, in the surface of the SOD film by the agency of radicals generated by ionizing the rare gas with electron beams. Thus, the molecular structure of the surface of the SOD film is modified and bears a closer resemblance to that of an inorganic film of $SiO_2$, SiN, SiC or the like, and the affinity of the SOD film for an inorganic film can be enhanced. Consequently, the adhesion of the inorganic film of $SiO_2$, SiN, SiC or the like to the SOD film enhances and the inorganic film adheres firmly to the SOD film.

Thus, shrinking and curing increase the mechanical strength of the surface layer of the SOD film, and the adhesion of the protective film to the SOD film is enhanced. Consequently, the protective film does not come off the SOD film or is not damaged even if the protective film is stressed horizontally in the CMP process following the protective film forming process.

EXAMPLES

Examples 1 to 11 of The method of the present invention will be explained in connection with graphs shown in FIGS. 5a to 9b. In Examples 1 to 11, the electron-beam tubes 4 of the electron-beam processing device 1 were provided with transparent quartz glass windows of 1 μm in thickness, and the distance between the quartz glass windows of the electron-beam tubes 4 and a wafer was 75 mm.

Example 1

SOD films of methylsilsesquioxane (MSQ) having different thicknesses were processed by a EV curing process. The dependence of shrinkage percentage on the thickness of the SOD film before processing is shown by a curve indicated at STD in FIG. 5a. The dependence of the reduction ratio of methyl groups in the SOD film on the thickness of the SOD film before processing is shown by a curve indicated at "STD" in FIG. 5b. The reduction of methyl groups is represented by a change in the content of the methyl group expressed by the ratio between the amounts of absorbed infrared radiation absorbed by Si—$CH_3$ and that of Si—O measured by a Fourier transform infrared spectroscopy (FT-IR), namely, the Si—$CH_3$/Si—O ratio. The wettability of the SOD film processed by the EB curing process is expressed by measured contact angle between water and the SOD film. The wettability is shown in Table 1. The SOD films were formed of LKD5109 commercially available from JSR Inc. in a thickness of 5000 Å.

[Process Conditions for Example 1]
Voltage: 13 kV
Current: 250 μA
Ar supply rate: 3000 sccm
Ar pressure: 10 torr
Processing time: 210 sec
Wafer temperature: 350° C.

Control 1

The same SOD films as those processed by the method in Example 1 were processed by a method in Control 1 including an EB curing process using He gas as the rare gas. Measured data on the samples processed by Control 1 is represented by curves indicated at "He" in FIGS. 5a and 5b. The wettability of the SOD films processed by the method in Control 1 including the EB curing process is shown in Table 1.

[Process Conditions for Control 1]
Voltage: 13 kV
Current: 90 μA
He supply rate: 3000 sccm
He pressure: 10 torr
Processing time: 210 sec
Wafer temperature: 350° C.

Comparative Example 1

The same SOD films as those processed by the method in Example 1 were processed by a method in Comparative example 1 using a conventional heat curing process. Measured data on the samples processed by Comparative example 1 is represented by curves indicated at "Heat cure" in FIGS. 5a and 5b. The wettability of the SOD films processed by the method in Control 1 including the EB curing process is shown in Table 1.

[Processing Conditions for Comparative Example 1]
Heat curing method: Heating by hot plate
Wafer temperature: 420° C.
Processing time: 60 min

TABLE 1

|  | Contact angle |
| --- | --- |
| Example 1 | 58 deg. |
| Control 1 | 90 deg. |
| Com. Example 1 | 103 deg. |

It is known from measured data shown in FIGS. 5a and 5b that the shrinkage percentage of the surface layer of the SOD film is large and the Si—$CH_3$/Si—O ratio decreases when the SOD film is processed by the method in Example 1 using Ar gas for creating the rare gas atmosphere. Both the shrinkage percentage and the Si—$CH_3$/Si—O ratio in the surface layer of the SOD film decrease scarcely and helium contributed scarcely to the reaction of the surface layer with radicals when the SOD film is processed by the method in Control 1 using He gas for forming the rare gas atmosphere.

It is known from the measured data shown in Table 1 that only the contact angle between water and the SOD film processed by the method in Example 1 is small, and the same SOD film has an improved wettability. It is found that an EB curing process using a rare gas having a greater atomic number has a higher effect on improving film quality.

It is known from FIGS. 5a and 5b and Table 1 that the SOD film processed by the method in Comparative example 1 using the conventional heat curing process has a small shrinkage percentage, a high Si—$CH_3$/Si—O ratio, a large contact angle and has scarcely improved wettability.

The values of carbon content of the SOD films processed by the methods in Example 1 and Comparative example 1 were measured through SIMS analysis. It was found that the values of carbon content of parts in the depth range of 500 to 5000 Å of both the SOD films were fixed. It is known from this result that the alkyl group decreasing effect (effect on giving a hydrophilic property) of the plasma produced by ionizing Ar gas by electron-beam irradiation on decreasing the alkyl group concentration of the surface of the SOD film is unable to affect the depth of the SOD film.

Example 2-1

Figure 6A:
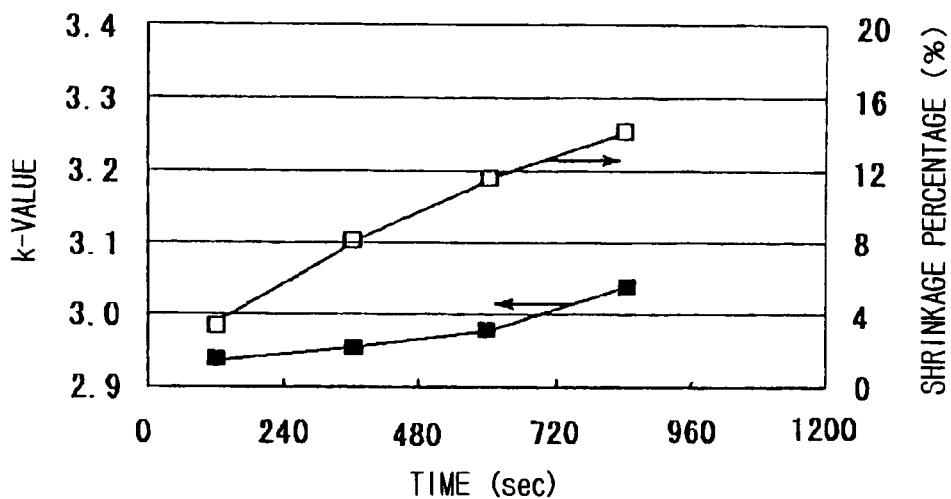
FIG. 6a is a graph showing the relation between processing time and the dielectric constant of SOD films in Example 2-1.

SOD films were processed by a method in Comparative example 2-1 including an EB curing process. The dependence of k-value, i.e., dielectric constant, and shrinkage percentage on processing time was examined. The results of examination are shown in FIG. 6a. It is known from FIG. 6a that both the k-value and the shrinkage percentage increase with processing time. A future design rule specifying dimensions of 0.13 μm or below requires a k-value of 3.0 or smaller. It is known from the examination of data shown in FIG. 6a taking into consideration such a requirement that the shrinkage percentage must be 12% or below. The SOD films were formed of LKD commercially available from JSR Inc. in a thickness of 5000 Å.

[Process Conditions for Example 2-1]
Voltage: 13 kV
Current: 250 μA
Ar supply rate: 3000 sccm
Ar pressure: 10 torr
Wafer temperature: 350° C.

Example 2-2

Figure 6B:
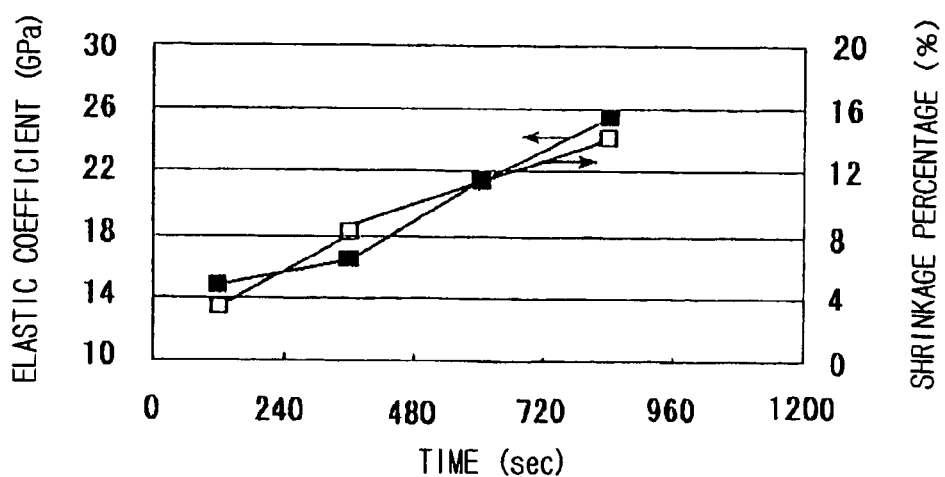
FIG. 6b is a graph showing the relation between processing time and the elastic modulus of SOD films in Example 2-2.

The same SOD films as those processed by the method in Example 2-1 were processed by a method in Example 2-2 including an EB curing process. The dependence of elastic coefficient and shrinkage percentage on processing time was examined. Results of examination are shown in FIG. 6b. It is known from FIG. 6b that both the elastic coefficient and the shrinkage percentage increase with processing time, and that the elastic coefficient increases and the mechanical strength enhances with the increase of the shrinkage percentage.

It is know from the results of examination of the SOD films processed by Examples 2-1 and 2-2 that it is preferable to increase the shrinkage percentage to an extent that does not increase the k-value.

Example 3-1

Figure 7A:
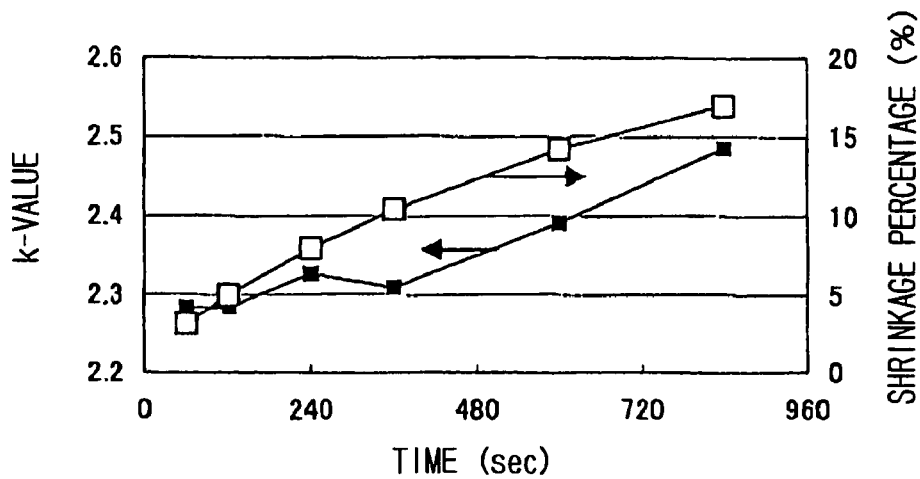
FIG. 7a is a graph showing the relation between processing time and the dielectric constant of SOD films in Example 3-1.

A method in Example 3-1 processed 5000 Å thick SOD film of porous MSQ material by an EB curing process under the same process conditions as those of Example 2-1, and the dependence of k-value and shrinkage percentage on processing time was examined. Results of examination are shown in FIG. 7a. A design rule specifying dimensions of 0.1 μm or below requires a k-value of about 2.3 or smaller. It is known from the examination of data shown in FIG. 7a taking into consideration such a requirement that the shrinkage percentage of the SOD film must be about 10% or below.

Example 3-2

Figure 7B:
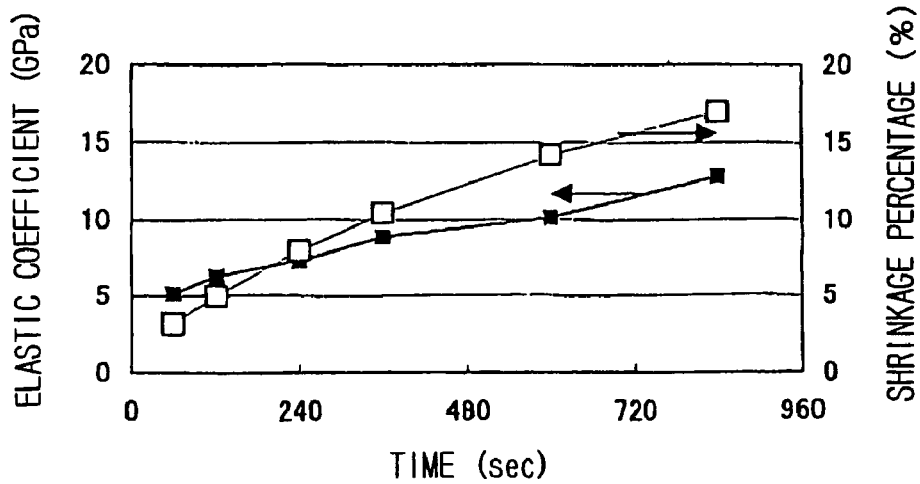
FIG. 7b is a graph showing the relation between processing time and the elastic modulus of SOD films in Example 3-2.

A method in Example 3-2 processed the same SOD film as that processed by Example 3-1 under the same process conditions as those for Example 3-1, and the dependence of elastic coefficient and shrinkage percentage on processing time was examined. Results of examination are shown in FIG. 7b. It is known from the examination of data shown in FIG. 7b that both the elastic coefficient and the shrinkage percentage increase with processing time, and the mechanical strength of the SOD film increases with processing time.

It is know from the results of examination of the SOD films processed by Examples 3-1 and 3-2 that it is preferable to increase the shrinkage percentage to an extent that does not increase the k-value.

Examples 4 to 6

Figure 8A:
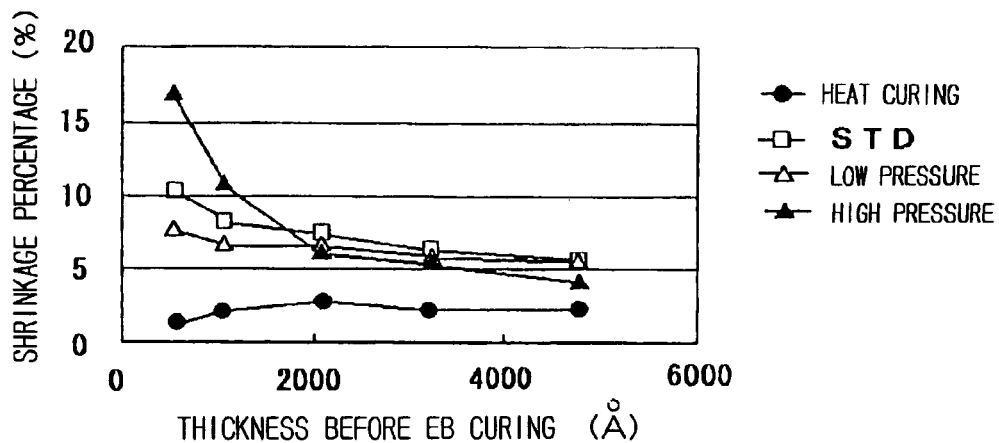
FIG. 8a is a graph showing the relation between the thickness of SOD films before processing, and shrinkage of the SOD films caused by electron-beam irradiation in Examples 4 to 6 and Comparative example 1.
Figure 8B:
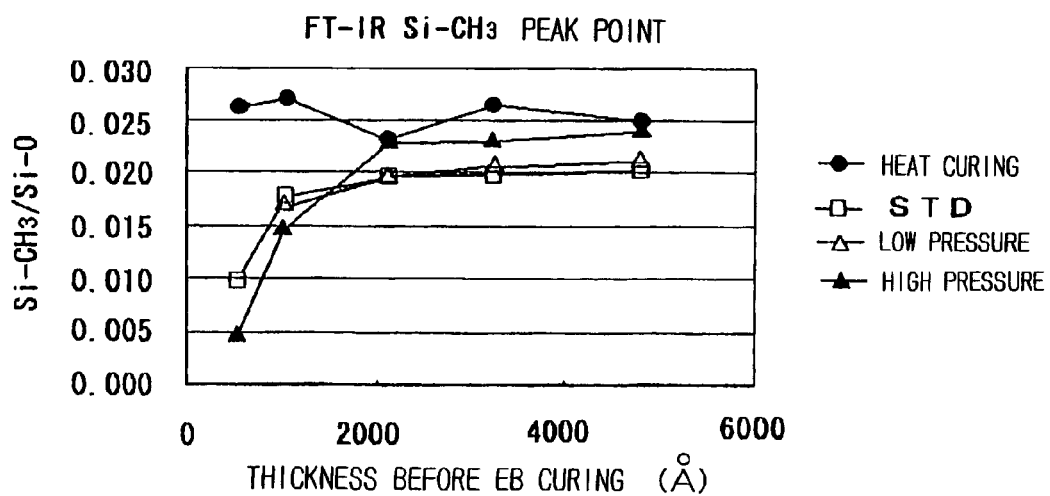
FIG. 8b is a graph showing the relation between the thickness of SOD films before processing, and the infrared absorption strength ratio of methyl groups measured by FT-IR in Examples 4 to 6 and Comparative example 1.

SOD films were processed by methods in Examples 4 to 6 to examine the pressure-dependence of an EB curing process. The pressures of Ar atmospheres used by Examples 4, 5 and 6 were a high pressure of 40 torr (HIGH), a low pressure of 1 torr (LOW), and a standard pressure of 10 torr (STD), respectively. Other process conditions are shown below. The SOD films were formed of LKD commercially available from JSR Inc. in a thickness of 5000 Å. FIGS. 8a and 8b correspond to FIGS. 5a and 5b, respectively.

[Process Conditions for Example 4]
Voltage: 13 kV
Current: 250 μA
Ar supply rate: 3000 sccm Processing time: 720 s
Wafer temperature: 350° C.
[Process Conditions for Example 5]
Voltage: 13 kV
Current: 120 µA
Ar supply rate: 3000 sccm
Processing time: 210 sec
Wafer temperature: 350° C.
[Process Conditions for Example 6]
Voltage: 13 kV
Current: 250 µA
Ar supply rate: 3000 sccm
Processing time: 210 sec
Wafer temperature: 350° C.

TABLE 2

|  | Contact angle |
| --- | --- |
| Example 4 | 22 deg. |
| Example 5 | 92 deg. |
| Example 6 | 58 deg. |
| Com. Example 1 | 103 deg. |

It is known from measure data shown in FIGS. 8a and 8b and Table 2 that the shrinkage percentages of surface layers of the SOD films, the value of Si—$CH_3$/Si—O measured by FT-IR decreases and the Si—$CH_3$/Si—O ratio decreases accordingly, and contact angle decreases greatly increase with the increase of the pressure of the Ar atmosphere. The surface layer of the SOD film is not improved and the SOD film is processed uniformly when the pressure of the Ar atmosphere is low. The measured data proved that the higher the pressure of the Ar atmosphere the greater is the effect of the method on the improvement of the quality of the surface layer of the SOD film. The effect of the pressure of the Ar atmosphere not higher than 1 torr on the shrinkage percentage and the amount of Si—$CH_3$ measured by FT-IR is insignificant, and Ar gas is scarcely effective in improving the surface layer of the SOD film.

Examples 7 and 8

Figure 9A:
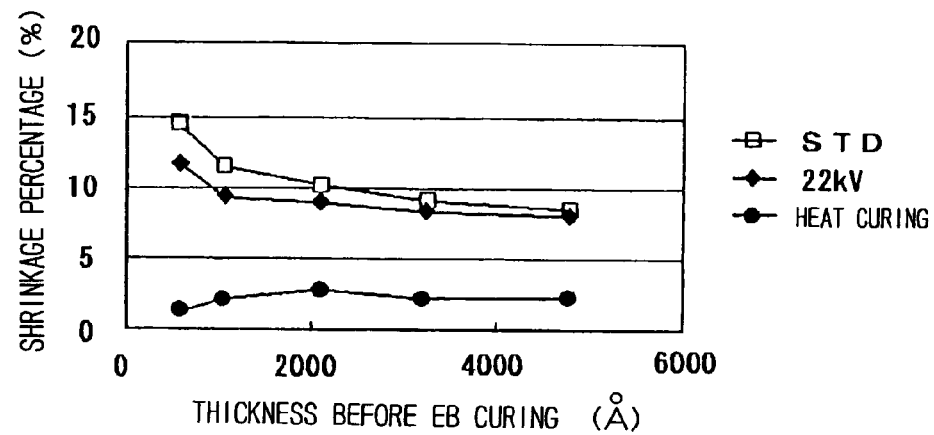
FIG. 9a is a graph showing the relation between the thickness of SOD films before processing, and shrinkage caused by electron-beam irradiation by Examples 7 and 8 and Comparative example 1.
Figure 9B:
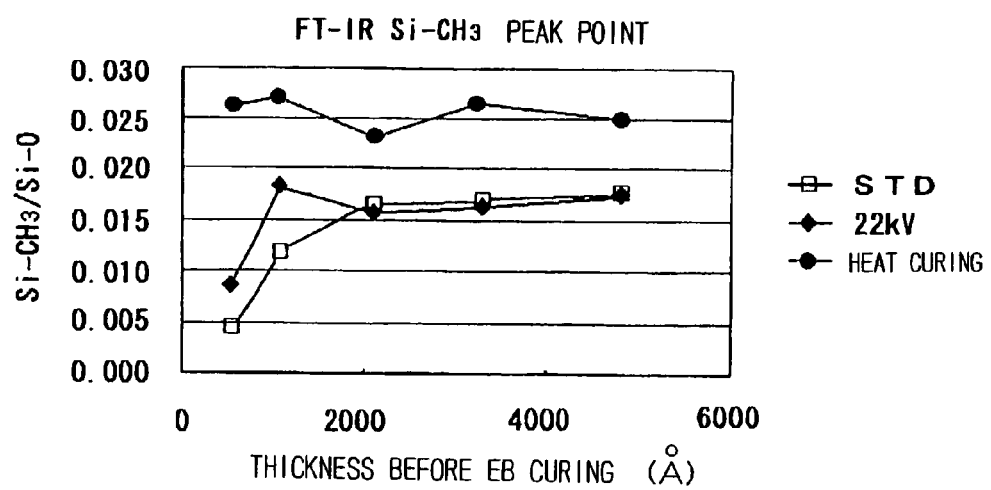
FIG. 9b is a graph showing the relation between the thickness of SOD films before processing, and the infrared absorption strength ratio of methyl groups in SOD films measured by FT-IR after being processed by Examples 7 and 8 and Comparative example 1.

SOD films were processed by methods in Examples 7 and 8 to examine the dependence of the effect of the EB curing process on voltage applied to the electron-beam tubes. A high voltage of 22 kV and a low voltage of 13 kV were used in Examples 7 and 8, respectively. Data on the SOD films was measured after processing the SOD film by EB curing processes. Measured data is shown in FIGS. 9a and 9b and Table 3. The SOD films were formed of LKD commercially available from JSR Inc. IN A THICKNESS OF 5000 Å. FIGS. 9a and 9b correspond to FIGS. 5a and 5b, respectively.
[Process Conditions for Example 7]
Current: 100 µA
Ar supply rate: 3000 sccm
Ar pressure: 10 torr
Processing time: 720 s
Wafer temperature: 350° C.
[Process Conditions for Example 8]
Current: 75 µA
Ar supply rate: 3000 sccm
Ar pressure: 10 torr
Processing time: 240 s
Wafer temperature: 350° C.

TABLE 3

|  | Contact angle |
| --- | --- |
| Example 7 | 38 deg. |
| Example 8 | 58 deg. |
| Com. Example 1 | 103 deg. |

It is known from the measured data shown in FIGS. 9a and 9b and Table 3 that the shrinkage percentage of the surface layer of the SOD film processed by the EB curing process using the high voltage is slightly smaller than of the surface layer of the SOD film processed by the EB curing process using the low voltage, the methyl group content of the former is slightly greater than that of the latter, and the contact angle of the former is large. It is known from the measured data that it is preferable that the voltage is lower than 22 kV.

Example 9

A method in Example 9 includes an EB curing process divided into a first half stage and a second half stage. Both the pressure of an Ar atmosphere and the voltage applied to the electron-beam tubes were changed simultaneously in the EB curing process. The pressure of the Ar atmosphere was 10 torr, the voltage was 25 kV and the working current was 100 µA for the first half stage. The first half stage was continued for 2 min to cure the SOD film. The pressure of the Ar atmosphere was 40 torr, the voltage was 23 kV and the working current was 100 µA for the second half stage. The second half stage was continued for 6 min to make the SOD film hydrophilic. The SOD film thus processed had a k-value of 2.3 a contact angle of 10°, high wettability, and an excellent adhesive property. The SOD film was formed of LKD in a thickness of 5000 Å.

Control 2

A method in Control 2 includes only the first half stage of the EB curing process included in Example 9. Although a SOD film processed by Control 2 has the same k-value of 2.3 as that processed by Example 9, the SOD film had a contact angle of 60°, which proved that the SOD film is inferior in wettability and adhesive property to the SOD film processed by Example 9.

Example 10

A method in Example 10 includes the same EB curing process as that included in the method in Example 9. The methyl group content of a surface layer of a SOD film processed by Example 10 and that of the same SOD film were measured by FT-IR. A protective film of $SiO_2$ was formed on the SOD film processed by the EB curing process, and the structure of the SOD film and the protective film was subjected to a peeling test. The sample SOD film processed by the heat curing process in Comparative example 1 was subjected to the same measurement and test. Measured results ate shown in Table 4.

TABLE 4

| Sample | Example 10 | Com. example 1 |
| --- | --- | --- |
| Si—$CH_3$/Si—O ratio (Surface layer of 500 Å) | 0.005 | 0.025 |
| Si—$CH_3$/Si—O ratio (SOD film) | 0.015 | 0.025 |
| Tape test | Not peeled | Peeled |

As obvious from Table 4, the methyl group content of the surface layer of the SOD film processed by Example 10 is far less than that of the same SOD film, and the SOD film processed by Example 10 has high wettability. Such a property of the SOD film is proved also by the result of the tape test, i.e., the tape peel test. It is known from the measure data on the SOD film processed by Comparative example 1 that the respective methyl group contents of the surface layer of the SOD film and the same SOD film are the same, the protective film came off the SOD film, and the adhesion of the protective film to the SOD film is insufficient.

Example 11

A method in Example 11 includes an EB curing process using an Ar atmosphere of 10 torr, 13 kV (working current of 100 µA) applied to the electron-beam tubes, and an EB irradiation time of 12 min. A SOD film of LKD having a thickness of 7500 Å was processed. The shrinkage percentages of a surface layer of a thickness of 1000 Å of the EB cured SOD film, and an inner layer between depths of 1000 Å and 7500 Å of the same SOD film were measured by an optical film thickness meter. Measured data are shown in Table 5.

As obvious from Table 5, the shrinkage percentage of the surface layer of the SOD film processed by Example 11 is approximately twice that of the inner layer of the same SOD film, which proves that the mechanical strength of the surface layer is far higher than that of the inner layer. The respective shrinkage percentages of the surface layer and the inner layer of the SOD film processed by Comparative example 1 are the same, which proves that the Comparative example 1 is scarcely effective in improving the mechanical strength of the surface layer of the SOD film.

TABLE 5

| | Shrinkage percentage | |
|---|---|---|
| Measured part | Example 11 | Com. example 1 |
| 0-1000 Å | 12% | 3% |
| 1000-7500 Å | 7% | 3% |

The present invention is not limited in its practical application to the foregoing methods in the embodiment and examples. Although the invention has been described as applied to modifying the SOD film and forming the protective film on the modified SOD film, the present invention is applicable to forming a film other than the protective film, such as another SOD film, a hard mask or a resist mask, on the modified SOD film.

What is claimed is:

1. A method of forming a polar liquid film on a surface of an organic film formed on a substrate in a processing vessel, the organic film comprising silicon, carbon, hydrogen and oxygen, said method comprising:
    a modifying step of curing the organic film and imparting an affinity for the polar liquid to the organic film by irradiating the organic film with electron beams by means of an electron-beam irradiation device in a rare gas atmosphere formed in the processing vessel, the rare gas having an atomic number not smaller than that of argon; and
    an applying step of applying the polar liquid to the surface of the organic film processed by the modifying step,
    said modifying step comprising the sub-steps of:
        curing the organic film by irradiating the organic film with the electron beams in the rare gas atmosphere of a first pressure in the processing vessel, the first pressure being below 1 torr; and
        imparting the affinity for the polar liquid to the organic film by irradiating the organic film with the electron beams in the rare gas atmosphere of a second pressure, the second pressure being 1 torr or above, to obtain a water contact angle of 58° or less on the organic film.

2. The method according to claim 1, wherein the voltage applied to the electron-beam irradiation device comprises:
    a first voltage at the sub-step of curing the organic film, and
    a second voltage lower than the first voltage at the sub-step of imparting the affinity.

3. The method according to claim 2, wherein the first voltage is above 20 kV and the second voltage is 20 kV or below.

4. The method according to claim 1, wherein the sub-step of imparting the affinity is carried out with the second pressure of 2 to 10 torr while heating the substrate at 200° C. to 400° C.

5. A method of forming an inorganic film on a surface of an organic film formed on a substrate in a processing vessel, the organic film comprising silicon, carbon, hydrogen and oxygen, said method comprising:
    a modifying step of curing the organic film and imparting an affinity for the inorganic film to the organic film by irradiating the organic film with electron beams by means of an electron-beam irradiation device in a rare gas atmosphere formed in the processing vessel, the rare gas having an atomic number not smaller than that of argon; and
    a film forming step of forming the inorganic film on the surface of the organic film processed by the modifying step,
    said modifying step comprising the sub-steps of:
        curing the organic film by irradiating the organic film with the electron beams in the rare gas atmosphere of a first pressure in the processing vessel, the first pressure being below 1 torr; and
        imparting the affinity for the inorganic film to the organic film by irradiating the organic film with the electron beams in the rare gas atmosphere of a second pressure, the second pressure being 1 torr or above, to obtain a water contact angle of 58° or less on the organic film.

6. The method according to claim 5, wherein the voltage applied to the electron-beam irradiation device comprises:
    a first voltage at the sub-step of curing the organic film, and
    a second voltage lower than the first voltage at the sub-step of imparting the affinity.

7. The method according to claim 6, wherein the first voltage is above 20 kV and the second voltage is 20 kV or below.

8. The method according to claim 5, wherein the sub-step of imparting the affinity is carried out with the second pressure of 2 to 10 torr while heating the substrate at 200° C. to 400° C.

9. A method of forming a polar liquid film on a surface of an organic film formed on a substrate in a processing vessel, the organic film comprising silicon, carbon, hydrogen and oxygen, said method comprising:
    a modifying step of curing the organic film and imparting an affinity for the polar liquid to the organic film by irradiating the organic film with electron beams by means of an electron-beam irradiation device in a rare gas atmosphere formed in the processing vessel, the rare gas having an atomic number not smaller than that of argon; and an applying step of applying the polar liquid to the surface of the organic film processed by the modifying step, said modifying step comprising the sub-steps of:
curing the organic film entirely by irradiating the organic film with the electron beams with a first voltage applied to the electron-beam irradiation device, in the rare gas atmosphere of a first pressure in the processing vessel, the first pressure being below 1 torr;
further curing a surface of the organic film by irradiating the organic film with the electron beams with a second voltage lower than the first voltage applied to the electron-beam irradiation device, in the rare gas atmosphere of the first pressure in the processing vessel; and
imparting the affinity for the polar liquid to the organic film by irradiating the organic film with the electron beams with the second voltage applied to the electron-beam irradiation device, in the rare gas atmosphere of a second pressure, the second pressure being 1 torr or above, to obtain a water contact angle of 58° or less on the organic film.

10. The method according to claim 9, wherein the first voltage is above 20 kV and the second voltage is 20 kV or below.

11. A method of forming an inorganic film on a surface of an organic film formed on a substrate in a processing vessel, the organic film comprising silicon, carbon, hydrogen and oxygen, said method comprising:
a modifying step of curing the organic film and imparting an affinity for the inorganic film to the organic film by irradiating the organic film with electron beams by means of an electron-beam irradiation device in a rare gas atmosphere formed in the processing vessel the rare gas having an atomic number not smaller than that of argon; and
a film forming step of forming the inorganic film on the surface of the organic film processed by the modifying step, said modifying step comprising the sub-steps of:
curing the organic film entirely by irradiating the organic film with the electron beams with a first voltage applied to the electron-beam irradiation device, in the rare gas atmosphere of a first pressure in the processing vessel, the first pressure being below 1 torr;
further curing a surface of the organic film by irradiating the organic film with the electron beams with a second voltage lower than the first voltage applied to the electron-beam irradiation device, in the rare gas atmosphere of the first pressure in the processing vessel; and
imparting the affinity for the inorganic film to the organic film by irradiating the organic film with the electron beams with the second voltage applied to the electron-beam irradiation device, in the rare gas atmosphere of a second pressure, the second pressure being 1 torr or above, to obtain a water contact angle of 58° or less on the organic film.

12. The method according to claim 11, wherein the first voltage is above 20 kV and the second voltage is 20 kV or below.

* * * * *